United States Patent
Bowman et al.

(10) Patent No.: US 9,069,039 B1
(45) Date of Patent: Jun. 30, 2015

(54) POWER MEASUREMENT TRANSDUCER

(75) Inventors: John K. Bowman, Brighton, MA (US);
Steven R. Cieluch, Allston, MA (US);
David Boudreau, Methuen, MA (US);
Daniel A. Field, Northborough, MA (US); Dale T. Morgan, Waltham, MA (US)

(73) Assignee: EMC Corporation, Hopkinton, MA (US)

(*) Notice: Subject to any disclaimer, the term of this patent is extended or adjusted under 35 U.S.C. 154(b) by 302 days.

(21) Appl. No.: 13/251,166

(22) Filed: Sep. 30, 2011

(51) Int. Cl.
*G01R 1/44* (2006.01)
*G01R 31/28* (2006.01)
*G01R 31/26* (2014.01)

(52) U.S. Cl.
CPC ........ *G01R 31/2874* (2013.01); *G01R 31/2849* (2013.01); *G01R 31/2855* (2013.01); *G01R 31/2628* (2013.01)

(58) Field of Classification Search
USPC .................. 324/105, 750.03, 750.09, 750.11, 324/756.02, 762.02; 374/100, 170; 165/287
See application file for complete search history.

(56) References Cited

U.S. PATENT DOCUMENTS

| 6,144,215 | A  | * | 11/2000 | Maxwell et al. ......... 324/750.09 |
| 6,777,961 | B2 | * | 8/2004  | Hamamoto et al. .......... 324/703 |
| 6,886,976 | B2 | * | 5/2005  | Gaasch et al. .................... 374/5 |
| 7,856,341 | B2 | * | 12/2010 | Carlson et al. ................ 702/185 |
| 2002/0075024 | A1 | * | 6/2002 | Fredeman et al. ............ 324/760 |
| 2003/0062149 | A1 | * | 4/2003 | Goodson et al. ......... 165/104.11 |
| 2005/0189957 | A1 | * | 9/2005 | Lopez ........................... 324/760 |
| 2006/0246276 | A1 | * | 11/2006 | Chung .......................... 428/323 |
| 2006/0255822 | A1 | * | 11/2006 | Saito et al. .................... 324/760 |
| 2006/0290370 | A1 | * | 12/2006 | Lopez ........................... 324/765 |
| 2008/0054926 | A1 | * | 3/2008 | Lopez et al. .................. 324/760 |
| 2010/0274522 | A1 | * | 10/2010 | Sri-Jayantha et al. ........ 702/130 |
| 2012/0032810 | A1 | * | 2/2012 | Chillar et al. ................. 340/600 |
| 2013/0069678 | A1 | * | 3/2013 | Grosch et al. ............ 324/750.02 |

* cited by examiner

*Primary Examiner* — Huy Q Phan
*Assistant Examiner* — Thang Le
(74) *Attorney, Agent, or Firm* — Brian J. Colandreo; Mark H. Whittenberger; Holland & Knight LLP

(57) ABSTRACT

A power measurement transducer includes a first surface configured to thermally couple the power measurement transducer to a device under test. A second surface is essentially parallel to and spaced apart from the first surface. Two or more temperature measurement elements are positioned between the first and second surfaces. The power measurement transducer is configured to allow at least a portion of the power generated within the device under test to enter the power measurement transducer through the first surface and exit the power measurement transducer through the second surface.

17 Claims, 4 Drawing Sheets

POWER MEASUREMENT TRANSDUCER

TECHNICAL FIELD

This disclosure relates to measurement transducers and, more particularly, to measurement transducers that measure power generated by a device under test.

BACKGROUND

Measuring the heat dissipated by a device under test is often difficult. In the past, the voltage and current supplied to the device under test were measured, thus allowing for calculation of the power supplied to the device and, therefore, the heat dissipated. Unfortunately, obtaining accurate current measurements often proves difficult and often a plurality of voltages are supplied to a single device. Accordingly, since power is the product of voltage and current, a separate current measurement needs to be obtained for each unique voltage supplied to the device.

SUMMARY OF DISCLOSURE

In a first implementation, a power measurement transducer includes a first surface configured to thermally couple the power measurement transducer to a device under test. A second surface is essentially parallel to and spaced apart from the first surface. Two or more temperature measurement elements are positioned between the first and second surfaces. The power measurement transducer is configured to allow at least a portion of the power generated within the device under test to enter the power measurement transducer through the first surface and exit the power measurement transducer through the second surface.

One or more of the following features may be included. The device under test may be an integrated circuit. The integrated circuit may be a microprocessor. The two or more temperature measurements elements may include a thermocouple pair thermally centered with respect to the device under test. The two or more temperature measurements elements may include a plurality of thermocouples that are spatially distributed with respect to the device under test. At least four of the plurality of thermocouples may be electrically coupled in a series configuration to provide a higher level of resolution. The two or more temperature measurements elements may include at least two thermistor.

The second surface may be configured to thermally couple the power measurement transducer to a heat dissipation device. The heat dissipation device may include a heatsink. The heat dissipation device may include a cooling fan. The power measurement transducer may include one or more side surfaces that are essentially perpendicular to the first and second surfaces. An insulating material may be applied to the one or more side surfaces.

In another implementation, a power measurement transducer includes a first surface configured to thermally couple the power measurement transducer to a device under test. A second surface is essentially parallel to and spaced apart from the first surface. A plurality of thermocouples are spatially distributed with respect to the device under test and positioned between the first and second surfaces. The power measurement transducer is configured to allow at least a portion of the power generated within the device under test to enter the power measurement transducer through the first surface and exit the power measurement transducer through the second surface.

One or more of the following features may be included. The device under test may be an integrated circuit. The integrated circuit may be a microprocessor. At least two of the plurality of thermocouples may be electrically coupled in a series configuration to provide a higher level of resolution. The second surface may be configured to thermally couple the power measurement transducer to a heat dissipation device. The heat dissipation device may include a heatsink. The heat dissipation device may include a cooling fan. The power measurement transducer may include one or more side surfaces that are essentially perpendicular to the first and second surfaces. An insulating material may be applied to the one or more side surfaces.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
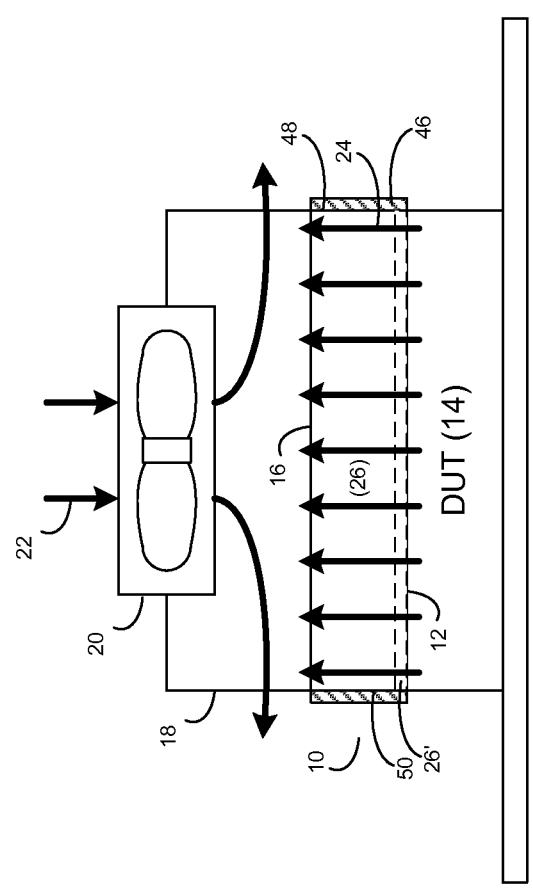
FIG. 1 is a diagrammatic view of a power measurement transducer.
Figure 2:
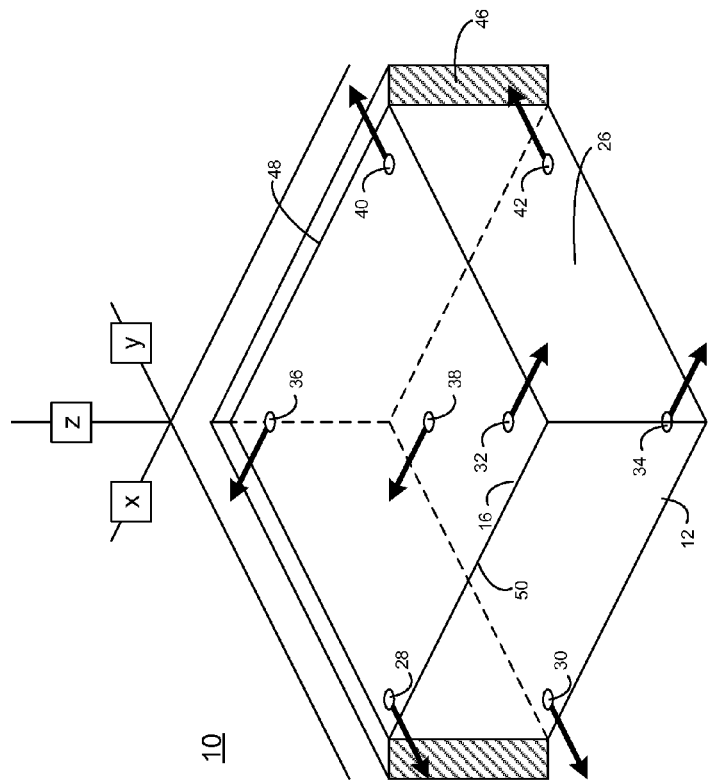
FIG. 2 is an isometric view of the power measurement transducer of FIG. 1.

Referring to FIGS. 1-2, there is shown power measurement transducer 10. Power measurement transducer 10 may include first surface 12 configured to thermally couple power measurement transducer 10 to a device under test (e.g. device under test 14). Examples of device under test 14 may include but are not limited to various integrated circuits (e.g. microprocessors) or any other device that produces heat (e.g. hard disk drives, memory controllers, network controllers, memory systems, and numeric processing units).

While most embodiments of first surface 12 would be generally planar in nature, first surface 12 may be configured in whatever fashion is required to properly couple with device under test 14. As discussed above, first surface 12 may be configured to thermally couple power measurement transducer 10 to device under test 14. Accordingly, the general shape of first surface 12 should be complimentary of the general shape of the surface of device under test 14 to which power measurement transducer 10 is being attached.

For example, if the surface of device under test 14 to which power measurement transducer 10 is being attached is generally planar, first surface 12 of power measurement transducer 10 should also be generally planar. Conversely, if the surface of device under test 14 to which power measurement transducer 10 is being attached is generally convex, first surface 12 of power measurement transducer 10 should be generally concave. Further, if the surface of device under test 14 to which power measurement transducer 10 is being attached is generally concave, first surface 12 of power measurement transducer 10 should be generally convex. Regardless of the individual shape of first surface 12 of power measurement transducer 10 and the corresponding surface on device under test 14, some form of thermally conductive paste may be used to fill any air gaps between power measurement transducer 10 and device under test 14.

Power measurement transducer 10 may include second surface 16 that is essentially parallel to and spaced apart from first surface 12. Second surface 16 may be configured to thermally couple power measurement transducer 10 to a heat dissipation device 18 (e.g., a heatsink). Heat dissipation device 18 may include cooling fan 20 to move cooling air 22 through heat dissipation device 18 and convectively cool device under test 14.

Specifically, power measurement transducer 10 may be configured to allow at least a portion of the power (e.g., thermal energy 24) generated within device under test 14 to enter power measurement transducer 10 through first surface 12 (via conduction) and exit power measurement transducer 10 through second surface 16 (via conduction).

While most embodiments of second surface 16 would be generally planar in nature, second surface 16 may be configured in whatever fashion is required to properly couple with heat dissipation device 18. As discussed above, second surface 16 may be configured to thermally couple power measurement transducer 10 to heat dissipation device 18. Accordingly, the general shape of second surface 16 should be complimentary of the general shape of the surface of heat dissipation device 18 to which power measurement transducer 10 is being attached.

For example, if the surface of heat dissipation device 18 to which power measurement transducer 10 is being attached is generally planar, second surface 16 of power measurement transducer 10 should also be generally planar. Conversely, if the surface of heat dissipation device 18 to which power measurement transducer 10 is being attached is generally convex, second surface 16 of power measurement transducer 10 should be generally concave. Further, if the surface of heat dissipation device 18 to which power measurement transducer 10 is being attached is generally concave, second surface 16 of power measurement transducer 10 should be generally convex. As with first surface 12, regardless of the individual shape of second surface 16 of power measurement transducer 10 and the corresponding surface on heat dissipation device 18, some form of thermally conductive paste may be used to fill any air gaps between power measurement transducer 10 and heat dissipation device 18.

Power measurement transducer 10 may include a thermally conductive heat spreading device (e.g., thermally conductive heat spreading device 26). In this particular embodiment of power measurement transducer 10, thermally conductive heat spreading device 26 is essentially the main body of power measurement transducer 10. However, other configurations are possible and are considered to be within the scope of this disclosure. For example, a separate thermally conductive heat spreading device (e.g., thermally conductive heat spreading device 26') may be included within power measurement transducer 10 that is separate from but thermally coupled to the main body of power measurement transducer 10.

Thermally conductive heat spreading device 26 may be configured to evenly distribute the heat flux across the XY plane formed by power measurement transducer 10. For example, assume that device under test 14 does not heat uniformly when in use and that it has several areas of high heat flux distributed across the XY plane. Accordingly, the portions of power measurement transducer 10 that are positioned proximate these areas of high heat flux will be generally warmer than the portions of power measurement transducer 10 that are positioned away from these areas of high heat flux. Therefore, through the use of thermally conductive heat spreading device 26, the power from these areas of high heat flux may be transferred away to areas of low heat flux, thus evening out the heat flux across the XY plane. Accordingly, thermally conductive heat spreading device 26 may be constructed of a thermally conductive material (e.g., aluminum) to effectuate such heat transfer.

One or more temperature measurement elements (e.g., elements 28, 30, 32, 34, 36, 38, 40, 42) may be positioned within power measurement transducer 10 (typically within thermally conductive heat spreading device 26). Through the use of these temperature sensing elements (e.g., elements 28, 30, 32, 34, 36, 38, 40, 42), the amount of power produced by device under test 14 may be determined.

The temperature measurement elements (e.g., elements 28, 30, 32, 34, 36, 38, 40, 42) may be positioned between first surface 12 and second surface 16 of power measurement transducer 10. For example, thermally conductive heat spreading device 26 may be machined so that the temperature measurement elements are positioned within power measurement transducer 10. One such example of the temperature measurement elements includes a single pair of thermocouples (such as those available from Omega Engineering) thermally centered with respect to device under test 14. For example, a single thermocouple pair may be used to generate a measurement concerning the amount of power produced by device under test 14.

Another example of the temperature measurement elements includes a plurality of thermocouples that are spatially distributed with respect to device under test 14. Accordingly, several thermocouples may be arranged with respect to power measurement transducer 10 (e.g., in the arrangement shown in FIG. 2) so that several temperature readings are made across the XY plane of thermally conductive heat spreading device 26. Through this methodology, the complications concerning areas of high heat flux are mitigated due to the use of the thermally conductive heat spreading device 26 and the distribution of multiple temperature measurement elements.

Another example of the temperature measurement elements includes the use of two or more thermistors (such as those available from Omega Engineering).

As is known in the art, a thermistor is a type of resistor whose resistance varies significantly with temperature (i.e., more so than with standard resistors). Thermistors may be used as inrush current limiters, temperature sensors, self-resetting overcurrent protectors, and self-regulating heating elements.

Accordingly, when used with a constant current source, the voltage drop across a thermistor will vary depending upon the temperature experienced by the thermistor. Therefore, by monitoring the value of this voltage drop, the amount of power produced by device under test 14 may be determined.

As is also known in the art, a thermocouple is a device that includes two different conductors (i.e., usually metal alloys) that produce a temperature-dependent voltage potential. When such thermocouples are positioned and spaced apart from one another, these thermocouples will allow for differential temperature measurements with respect to the locations of the thermocouples. Accordingly, thermocouples may be used as temperature sensors for measurement and control.

Accordingly, the voltage potential across thermocouples will vary depending upon the differential temperature experienced by the thermocouples. Therefore, by monitoring the value of this voltage potential, the amount of power produced by device under test 14 may be determined.

Figure 3:
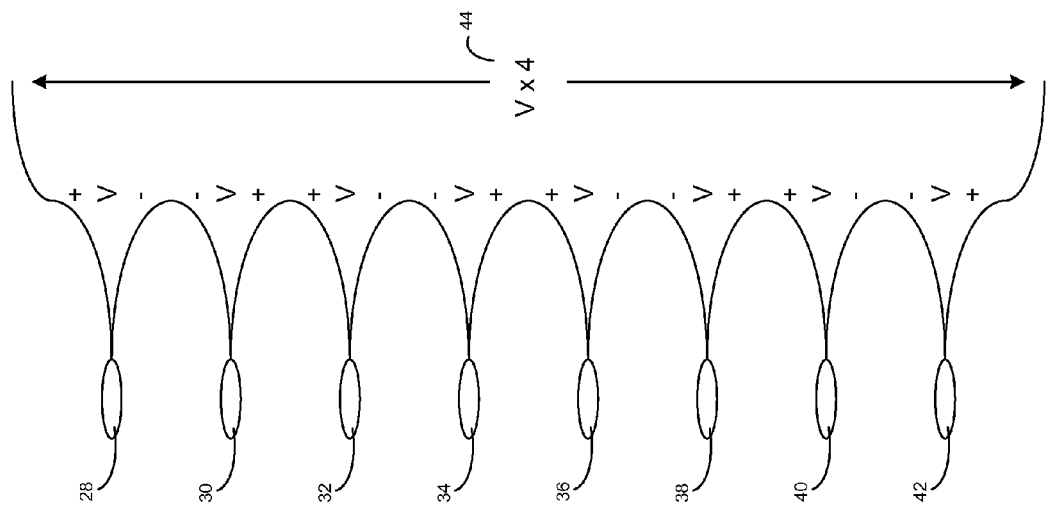
FIG. 3 is a schematic diagram showing a plurality of thermocouples wired in series.

Referring also to FIG. 3, in order to enhance the resolution of power measurement transducer 10 in systems that employ a plurality of thermocouples, four or more of the thermocouples may be electrically coupled in a series configuration to provide such higher resolution. For example, if eight temperature sensing elements 28, 30, 32, 34, 36, 38, 40, 42 where connected in a series configuration, the voltage potential generated by each of the thermocouples would be added together and this cumulative (e.g., voltage 44) may be utilized to determine the amount of power produced by device under test 14.

As shown in FIG. 2, temperature sensing elements 28, 30, 32, 34, 36, 38, 40, 42 may be arranged in two groups of four temperature sensing elements, namely temperature sensing elements 28, 32, 36, 40 being positioned in an upper plane within power measurement transducer 10 and temperature sensing elements 30, 34, 38, 42 being positioned within a lower plane within power measurement transducer 10. Further, by wiring temperature sensing elements 28, 30, 32, 34, 36, 38, 40, 42 in the manner shown in FIG. 3, the above-described differential temperature measurements may be made between the temperature sensing elements located in the upper plane of power measurement transducer 10 and those temperature sensing elements located within the lower plane of power measurement transducer 10, which may be utilized to determine the amount of power produced by device under test 14.

While the system is described above as positioning the thermocouples in rigid planes, this is for illustrative purposes only and is not intended to be a limitation of this disclosure as other configurations are possible and are considered to be within the scope of this disclosure. For example, the thermocouples need not be arranged in planes, as all that is needed is a variation along the z-axis of the individual thermocouples so that differential temperature readings may be established.

For example, when eight typical copper-constantan thermocouples are wired in series (as shown in FIG. 3), this group of thermocouples (often referred to as a thermopile) produces approximately 6 millivolts per watt of power to which it is exposed. Accordingly, FIG. 5 shows the relationship of watts sensed versus the value of voltage 44.

Figure 5:
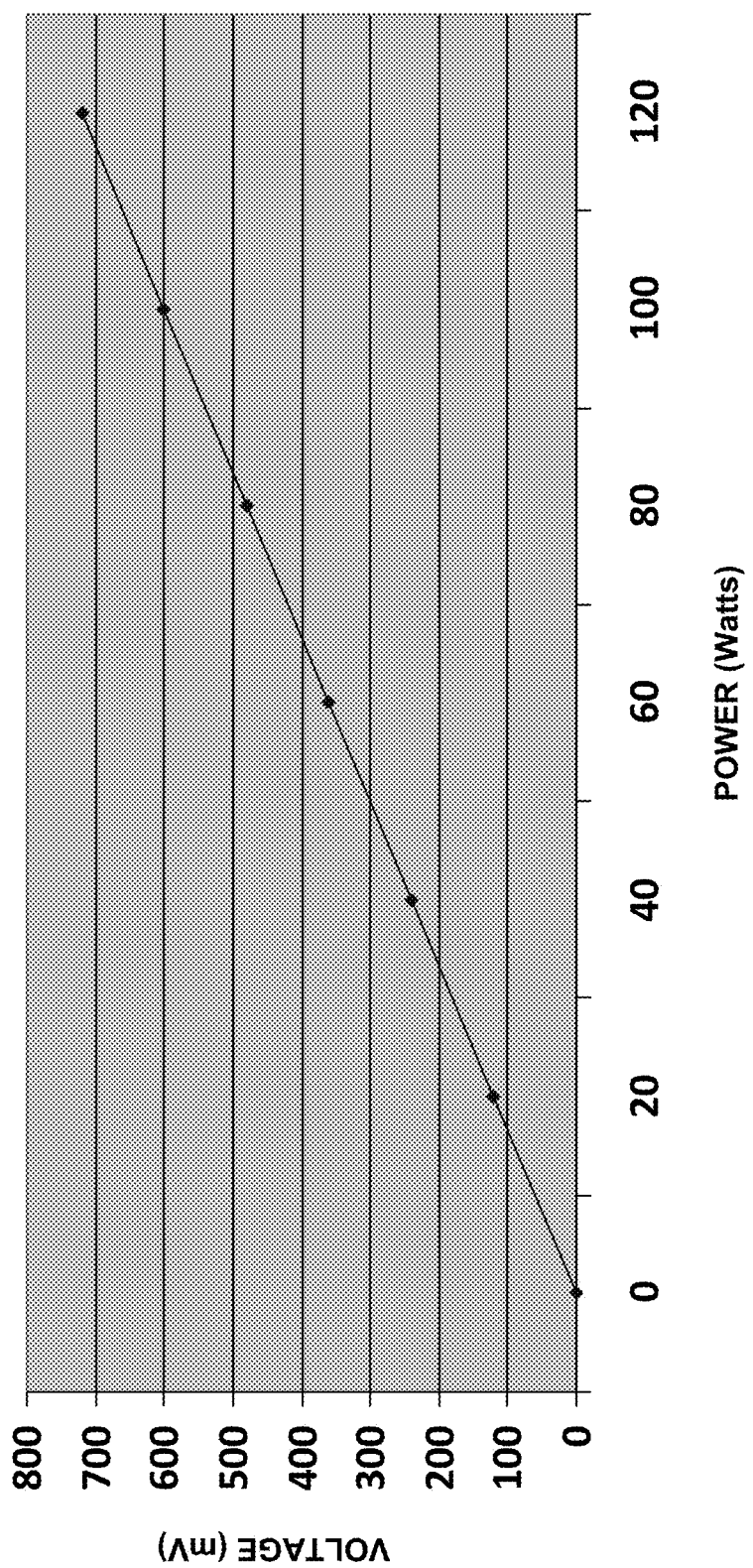
FIG. 5 is a chart showing the relationship of watts sensed versus the value of voltage.

In FIG. 5, the y-axis is the value of voltage 44 (in millivolts) and the x-axis is the amount of power produced by device under test 14 (in watts). The chart in FIG. 5 is for illustrative purposes only and is not intended to be a limitation of this disclosure, Specifically, the 6 millivolt per watt performance statistic described above is specific to one particular implementation of power measurement transducer 10 (i.e., an implementation from 1.5 inch×1.5 inch×0.5 inch machined aluminum). Accordingly, the performance static for other configurations/materials would vary from the system described above.

An insulating material (e.g., insulating material 46) may be applied to one or more side surfaces (e.g., side surfaces 48, 50) of power measurement transducer 10 so that the amount of power escaping through the side surfaces of power measurement transducer 10 may be minimized so that a more accurate measurement may be made by the above-described temperature sensing elements.

Figure 4:
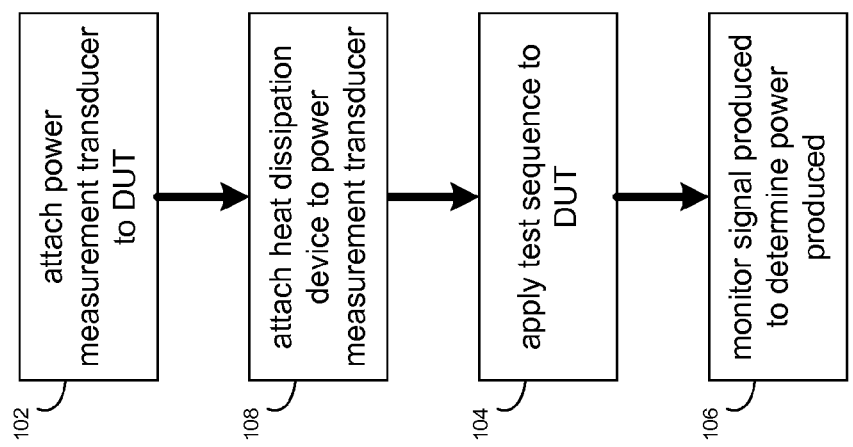
FIG. 4 is a flowchart of a method of using the power measurement transducer of FIG. 1.

Referring also to FIG. 4, there is shown a method 100 of determining thermal output of device under test 14 that includes attaching 102 power measurement transducer 10 to device under test 14. This may be accomplished in the manner described above using thermally conductive paste.

Method 100 may apply 104 a test sequence to device under test 14. For example, a test program may be written and executed for the device under test. This test program may be configured to cycle device under test 14 through a sequence of operations. Specifically, this test program may be written in a fashion so that the test program applies a level of stress to device under test 14 that is similar to the level of stress that device under test 14 would experience when being used in the fashion for which it is being tested.

Method 100 may monitor 106 the signals produced by power measurement transducer 10 to determine the quantity of power produced by device under test 14 during the test sequence. For example and from the chart in FIG. 5, if during the execution of the above-described test program, the maximum level of voltage 44 is 600 millivolts, this is indicative of power measurement transducer 10 sensing approximately 100 watts of power being produced by device under test 14.

Method 100 may also include attaching 108 heat dissipation device 18 to power measurement transducer 10. This may be accomplished in the manner described above using thermally conductive paste.

A number of implementations have been described. Nevertheless, it will be understood that various modifications may be made. Accordingly, other implementations are within the scope of the following claims.

What is claimed is:

1. A power measurement transducer comprising:
a first surface configured to thermally couple to a device under test;
a second surface essentially parallel to and spaced apart from the first surface;
a plurality of temperature measurement elements positioned within the power measurement transducer, wherein at least two of the plurality of temperature measurement elements are positioned in the first surface and at least two of the plurality of temperature measurement elements are positioned in the second surface; and
an insulating material applied to one or more side surfaces perpendicular to the first surface and the second surface, wherein the insulating material minimizes power escaping through the one or more side surfaces for a more accurate temperature measurement by the plurality of temperature measurement elements;
wherein the power measurement transducer is configured to allow at least a portion of the power generated within the device under test to enter the power measurement transducer through the first surface and exit the power measurement transducer through the second surface.

2. The power measurement transducer of claim 1 wherein the device under test is an integrated circuit.

3. The power measurement transducer of claim 2 wherein the integrated circuit is a microprocessor.

4. The power measurement transducer of claim 1 wherein the plurality of temperature measurement elements includes a thermocouple pair thermally centered with respect to the device under test.

5. The power measurement transducer of claim 1 wherein the plurality of temperature measurement elements includes a plurality of thermocouples that are spatially distributed with respect to the device under test.

6. The power measurement transducer of claim 5 wherein at least four of the plurality of thermocouples are electrically coupled in a series configuration to provide a higher level of resolution.

7. The power measurement transducer of claim 1 wherein the plurality of temperature measurements elements includes at least two thermistors.

8. The power measurement transducer of claim 1 wherein the second surface is configured to thermally couple the power measurement transducer to a heat dissipation device.

9. The power measurement transducer of claim 8 wherein the heat dissipation device includes a heatsink.

10. The power measurement transducer of claim 8 wherein the heat dissipation device includes a cooling fan.

11. A power measurement transducer comprising:
- a first surface configured to thermally couple to a device under test;
- a second surface essentially parallel to and spaced apart from the first surface;
- a plurality of thermocouples that are spatially distributed with respect to the device under test and positioned within the power measurement transducer, wherein at least two of the plurality of thermocouples are positioned in the first surface and at least two of the plurality of thermocouples are positioned in the second surface; and
- an insulating material applied to one or more side surfaces perpendicular to the first surface and the second surface, wherein the insulating material minimizes power escaping through the one or more side surfaces for a more accurate temperature measurement by the plurality of thermocouples;
- wherein the power measurement transducer is configured to allow at least a portion of the power generated within the device under test to enter the power measurement transducer through the first surface and exit the power measurement transducer through the second surface.

12. The power measurement transducer of claim 11 wherein the device under test is an integrated circuit.

13. The power measurement transducer of claim 12 wherein the integrated circuit is a microprocessor.

14. The power measurement transducer of claim 11 wherein at least two of the plurality of thermocouples are electrically coupled in a series configuration to provide a higher level of resolution.

15. The power measurement transducer of claim 11 wherein the second surface is configured to thermally couple the power measurement transducer to a heat dissipation device.

16. The power measurement transducer of claim 15 wherein the heat dissipation device includes a heatsink.

17. The power measurement transducer of claim 15 wherein the heat dissipation device includes a cooling fan.

* * * * *